(12) United States Patent
Fan

(10) Patent No.: US 10,381,531 B1
(45) Date of Patent: Aug. 13, 2019

(54) QUANTUM DOT LED AND MANUFACTURING METHOD FOR THE SAME

(71) Applicant: HUIZHOU CHINA STAR OPTOELECTRONICS TECHNOLOGY CO., LTD., Huizhou Guangdong (CN)

(72) Inventor: Yong Fan, Huizhou Guangdong (CN)

(73) Assignee: HUIZHOU CHINA STAR OPTOELECTRONICS TECHNOLOGY CO., LTD., Huizhou, Guangdong (CN)

( * ) Notice: Subject to any disclaimer, the term of this patent is extended or adjusted under 35 U.S.C. 154(b) by 0 days.

(21) Appl. No.: 16/007,852

(22) Filed: Jun. 13, 2018

Related U.S. Application Data

(63) Continuation of application No. PCT/CN2018/078804, filed on Mar. 13, 2018.

(30) Foreign Application Priority Data

Feb. 6, 2018 (CN) .......................... 2018 1 0118368

(51) Int. Cl.
| | | |
|---|---|---|
| *H01L 33/50* | (2010.01) | |
| *H01L 33/56* | (2010.01) | |
| *H01L 33/48* | (2010.01) | |
| *H01L 51/52* | (2006.01) | |

(52) U.S. Cl.
CPC ............ *H01L 33/56* (2013.01); *H01L 33/486* (2013.01); *H01L 33/502* (2013.01); *H01L 33/507* (2013.01); *H01L 51/5246* (2013.01); *H01L 33/504* (2013.01); *H01L 2933/005* (2013.01)

(58) Field of Classification Search
None
See application file for complete search history.

(56) References Cited

U.S. PATENT DOCUMENTS

| | | | |
|---|---|---|---|
| 2012/0091923 A1* | 4/2012 | Kastner-Jung | B60Q 3/745 |
| | | | 315/360 |
| 2014/0145165 A1* | 5/2014 | Woo | H01L 51/5256 |
| | | | 257/40 |
| 2016/0322454 A1* | 11/2016 | Zhang | H01L 27/3244 |
| 2017/0005238 A1* | 1/2017 | Hung | H01L 33/50 |
| 2017/0301843 A1* | 10/2017 | Kim | H01L 33/62 |
| 2017/0373264 A1* | 12/2017 | Liu | H01L 51/5012 |

FOREIGN PATENT DOCUMENTS

CN            107039573 A      8/2017

* cited by examiner

*Primary Examiner* — Cheung Lee
(74) *Attorney, Agent, or Firm* — Leong C. Lei

(57) ABSTRACT

A quantum dot LED and a manufacturing method for the same are disclosed. The quantum dot LED includes a pair of electrodes disposed separately and side by side; an LED chip disposed on the pair of electrodes and electrically connected to the pair of electrodes; a quantum dot layer disposed on the LED chip; a glue layer disposed on the quantum dot layer; and an inorganic encapsulation layer that packages and covers the pair of electrodes, the LED chip, the quantum dot layer and the glue layer. The present invention can provide a water and oxygen isolation environment, which is beneficial to increase the luminous efficiency and life of the quantum dots. Adopting an atomic layer deposition method to form the inorganic encapsulation layer, the surface is smooth and even in thickness, the problem of cracking of the film layer will not generate.

10 Claims, 2 Drawing Sheets

QUANTUM DOT LED AND MANUFACTURING METHOD FOR THE SAME

CROSS REFERENCE

This application is a continuing application of PCT Patent Application No. PCT/CN2018/078804, entitled "A QUANTUM DOT LED AND MANUFACTURING METHOD FOR THE SAME", filed on Mar. 13, 2018, which claims priority to China Patent Application No. CN201810118368.6 filed on Feb. 6, 2018, both of which are hereby incorporated in its entireties by reference.

FIELD OF THE INVENTION

The present invention relates to a display technology field, and more particularly to a quantum dot LED and manufacturing method for the same.

BACKGROUND OF THE INVENTION

A Quantum Dot (QD) is a semiconductor nanostructure that chains conduction band electron, valence band hole and exciton in three spaces, and also known as a Nano crystalline, and a nanoparticle that forms by II-VI group element or III-V element. A particle size of the quantum dot is generally ranged within 1~10 nm. Because electrons and holes are limited by the quantum dot, continuous band structure becomes a discrete energy level structure that has molecular characteristics and can emit florescent light after being excited. A Chip Scale Package (CSP) LED, as a frameless LED, has features of simple manufacturing process, good heat dissipation, small light-emitting surface such that the CSP LED has become an important development direction of the LED.

FIG. 1 is an absorption spectrum of red light quantum dot and green light quantum dot. FIG. 2 is an emission spectrum of red light quantum dot and green light quantum dot. In FIG. 1 and FIG. 2, a gray line represents the green light quantum dot, the black line represents the red light quantum dot. From FIG. 2, the FWHM (full width at half maximum) of the red light quantum dot and the green light quantum dot is very narrow such that adding quantum dots in a light source can greatly increase the color gamut of the liquid crystal display device.

However, the temperature quenching of the quantum is very serious, when the temperature is increased, the luminous efficiency is decreased. Besides, if the quantum dots are exposed in a water and oxygen environment, the luminous efficiency will decrease quickly. Accordingly, the quantum dot requires isolating the water and oxygen, the high temperature or providing a better heat dissipation environment.

SUMMARY OF THE INVENTION

The technology problem solved by the present invention is to provide a quantum dot LED and a manufacturing method for the same in order to increase an isolation ability to water and oxygen in a high temperature, high humidity environment.

In order to solve the above technology problem, the present invention provides a quantum dot LED, including:
a pair of electrodes disposed separately and side by side;
an LED chip disposed on the pair of electrodes and electrically connected to the pair of electrodes;
a quantum dot layer disposed on the LED chip;
a glue layer disposed on the quantum dot layer; and
an inorganic encapsulation layer that packages and covers the pair of electrodes, the LED chip, the quantum dot layer and the glue layer.

Wherein the inorganic encapsulation layer is manufactured by an atomic layer deposition method, and a thickness of the inorganic encapsulation layer is in a range of 10 nm to 120 nm.

Wherein the inorganic encapsulation layer is a single-layered structure, a material of the inorganic encapsulation layer is anyone of $Al_2O_3$, $ZrO_2$, and $TiO_2$.

Wherein materials of adjacent layers of the multi-layered structure of the inorganic encapsulation layer are different.

Wherein the quantum dot LED further includes an organic protection layer that packages and covers the inorganic encapsulation layer.

Wherein a refractive index of the organic protection layer is less than a refractive index of the inorganic encapsulation layer.

Wherein the LED chip is a blue LED chip.

The present invention also provides a manufacturing method for quantum dot LED, comprising:
disposing a pair of electrodes separately and side by side;
disposing an LED chip on the pair of the electrodes and electrically connecting the LED chip to the pair of the electrodes;
disposing a quantum dot layer on the LED chip;
disposing a glue layer on the quantum dot layer; and
using an atomic layer deposition method to form an inorganic encapsulation layer, and the inorganic encapsulation layer packages and covers the pair of electrodes, the LED chip, the quantum dot layer and the glue layer.

Wherein the manufacturing method further includes a step of disposing an organic protection layer, and the organic protection layer packages and covers the inorganic encapsulation layer.

The beneficial effect of the embodiment of the present invention is: through disposing an inorganic encapsulation layer capable of blocking the damage of water and oxygen to the LED chip in order to provide a water and oxygen isolation environment, which is beneficial to increase the luminous efficiency and life of the quantum dots. Adopting an atomic layer deposition method to form the inorganic encapsulation layer, the surface is smooth and even in thickness, the problem of cracking of the film layer will not generate. The quantum dot LED of the present embodiment can greatly increase the color gamut. When using as a backlight source, the color gamut of an LCD can reach BT2020>90%. Besides, the present invention can realize a four-side emitting of the LED, increase a square light control of HDR display, increase the quality of the LCD, and decreased the OD (optical density) height of the direct backlight module.

BRIEF DESCRIPTION OF THE DRAWINGS

In order to more clearly illustrate the technical solution in the present invention or in the prior art, the following will illustrate the figures used for describing the embodiments or the prior art. It is obvious that the following figures are only some embodiments of the present invention. For the person of ordinary skill in the art without creative effort, it can also obtain other figures according to these figures.

DETAILED DESCRIPTION OF THE PREFERRED EMBODIMENT

The illustration of the following embodiments can refer the drawings to illustratively describe specific embodiment that can achieve the present invention.

Figure 1:
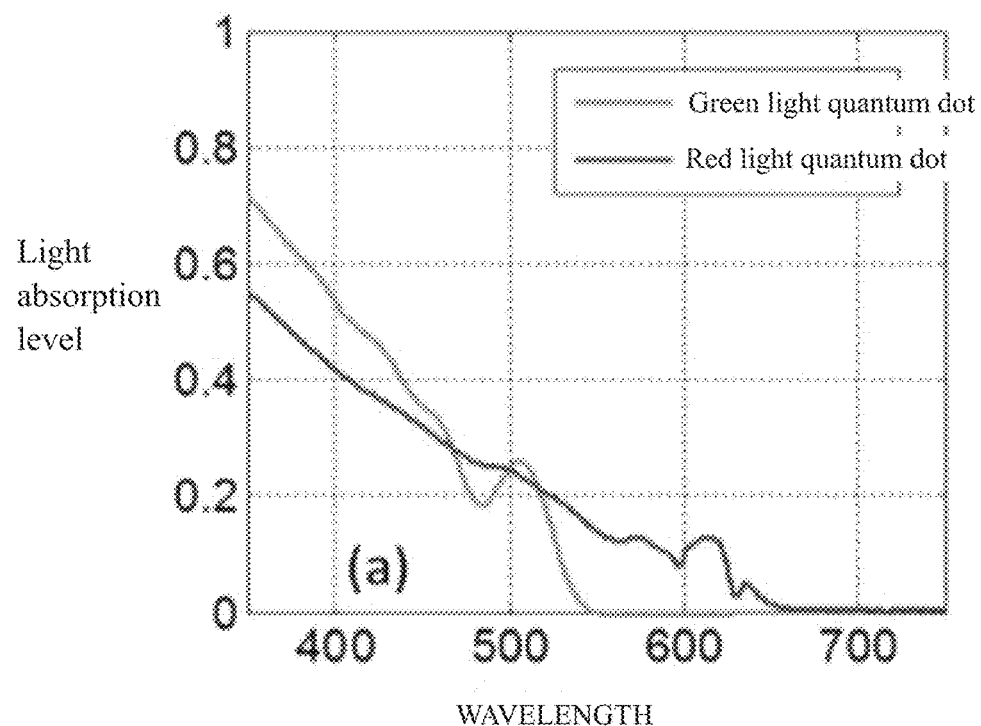
FIG. 1 is an absorption spectrum of red light quantum dot and green light quantum dot.
Figure 2:
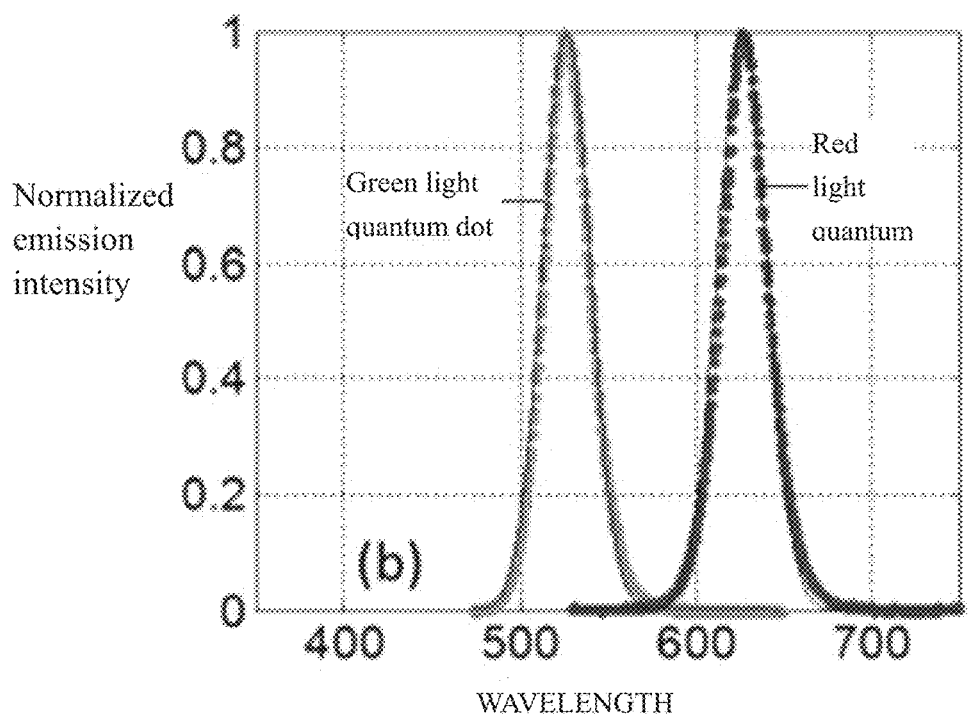
FIG. 2 is an emission spectrum of red light quantum dot and green light quantum dot.
Figure 3:
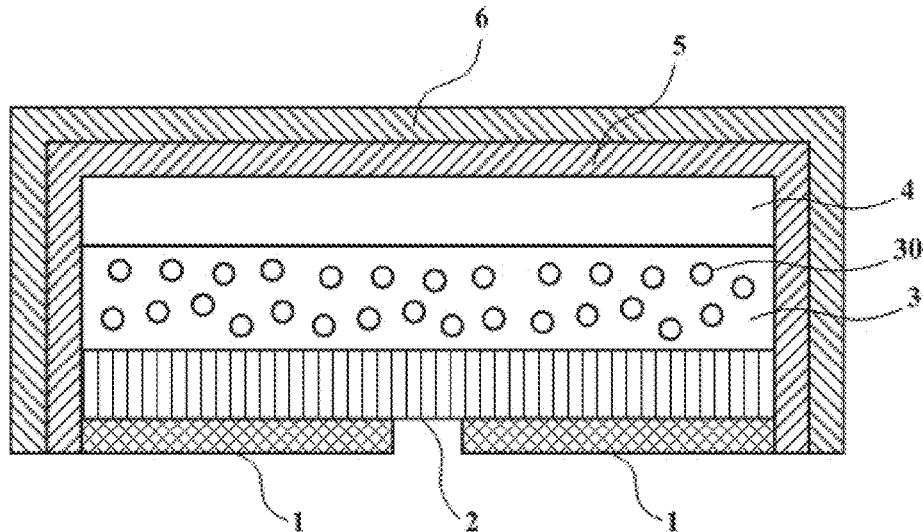
FIG. 3 is a schematic diagram of a quantum dot LED according to a first embodiment of the present invention.

With reference to FIG. 3, the embodiment of the present invention provides a quantum dot LED, including:

a pair of electrodes 1 disposed separately and side by side;

an LED chip 2 disposed on the pair of electrodes 1 and electrically connected to the pair of electrodes 1;

a quantum dot layer 3 disposed on the LED chip 2;

a glue layer 4 disposed on the quantum dot layer 3;

an inorganic encapsulation layer 5 that packages and covers the pair of electrodes 1, the LED chip 2, the quantum dot layer 3 and the glue layer 4.

Specifically, for the inorganic encapsulation layer 5 in the present embodiment, if adopting a sputtering coating or a PECVD method to manufacture the inorganic encapsulation layer 5, an uneven surface will generate to cause an uneven thickness so that the film is easily to crack. Accordingly, the inorganic encapsulation layer 5 adopts atomic layer deposition method to manufacture.

The inorganic encapsulation layer 5 can be a single-layered structure, or a multi-layered structure. When the inorganic encapsulation layer 5 is a single-layered structure, the material is anyone of $Al_2O_3$, $ZrO_2$, and $TiO_2$. When the inorganic encapsulation layer 5 is a multi-layered structure, each layer of the multi-layered structure is also anyone of $Al2O_3$, $ZrO_2$, and $TiO_2$. In order to reach a better isolation for water and oxygen, the multi-layered structure of the inorganic encapsulation layer 5 can utilize different material in the multi-layered structure. A thickness of the inorganic encapsulation layer 5 is in a range of 10 nm to 120 nm. Because an ALD method is adopted to form the film, the thickness of the inorganic encapsulation layer 5 will not be affect by a tape angle to form a film evenly so that a dense inorganic encapsulation layer can be formed to isolate the water and oxygen. The shape of the inorganic encapsulation layer 5 is a "⊓" shape, and the inorganic encapsulation layer 5 packages and covers the electrodes 1, the LED chip 2, the quantum dot 3 and the glue layer 4 to be inside in order to form a closed structure.

Because the thickness of the inorganic encapsulation layer 5 is thinner, in order to avoid from damaging the inorganic encapsulation layer 5 in assorting, packaging, LED wire bonding and light bar assembly, in the present embodiment, a surface of the inorganic encapsulation layer 5 is coated with an organic protection layer 6. Because the organic protection layer 6 will increase the thickness, a refractive index will increase, in order to decrease the refractive index, the refractive index of the organic protection layer 6 is less than the refractive index of the inorganic encapsulation layer 5. The shapes of the organic protection layer 6 and the inorganic encapsulation layer 5 are corresponding to form a "⊓" shape at the same time. The organic protection layer 6 can completely packages and covers the inorganic encapsulation layer 5 or packages a portion of the inorganic encapsulation layer 5.

The quantum dot layer includes a red light quantum dot and a green light quantum dot (numeral 30 shown in FIG. 3), and the LED chip 2 is a blue LED chip. The blue LED chip 2 emits a blue light when a power source is connected. After the blue light enters the quantum dot layer 3, the red light quantum dot and the green light quantum dot in the quantum dot layer 3 are excited to respectively emit a red light and a green light. The red light and the green light emitted from the quantum dot layer 3 are mixed with the blue light emitted from the LED chip 2 to emit a white light.

The glue layer 4 is disposed on the quantum dot layer 3 in order to isolate the quantum dot layer 3 from external water and oxygen to avoid the water and oxygen from entering the quantum dot layer 3 to cause a failure of the quantum dots.

Figure 4:
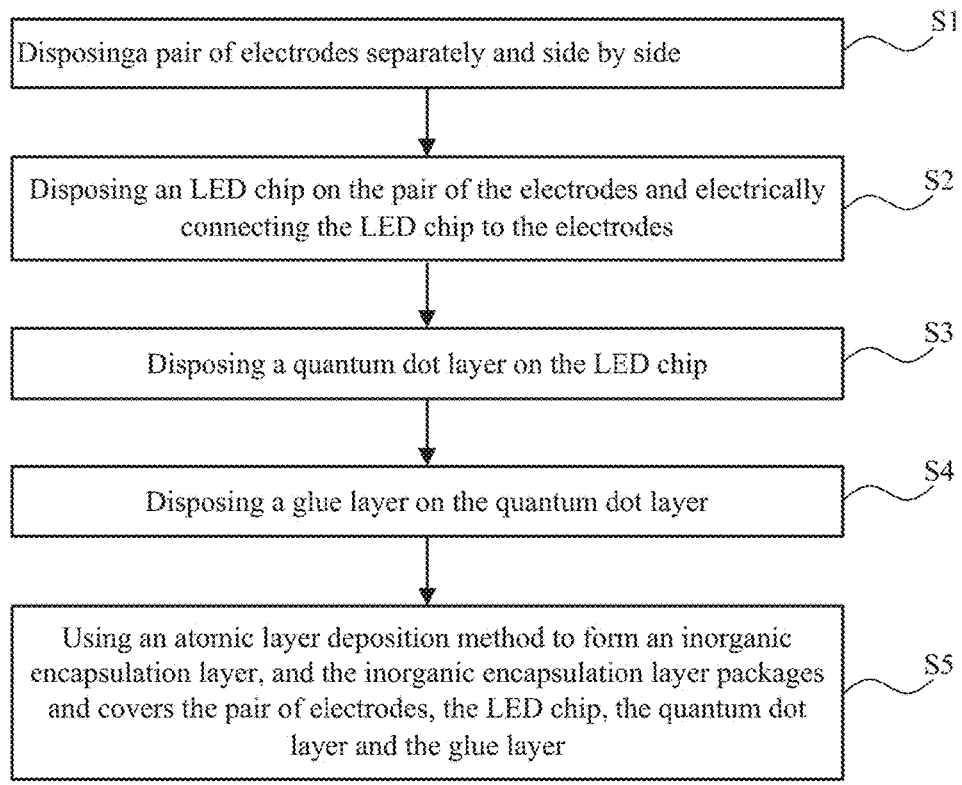
FIG. 4 is a flow chart of a quantum dot LED according to a second embodiment of the present invention.

With reference to FIG. 4, corresponding to the quantum dot LED in the first embodiment of the present invention, the second embodiment of the present invention further provides a manufacturing method for the quantum dot LED, and the method includes:

disposing a pair of electrodes separately and side by side;

disposing an LED chip on the pair of the electrodes and electrically connecting the LED chip to the pair of the electrodes;

disposing a quantum dot layer on the LED chip;

disposing a glue layer on the quantum dot layer;

using an atomic layer deposition method to form an inorganic encapsulation layer, and the inorganic encapsulation layer packages and covers the pair of the electrodes, the LED chip, the quantum dot layer and the glue layer.

Wherein, the manufacturing method further includes: disposing an organic protection layer, and the organic protection layer packages and covers the inorganic encapsulation layer.

Through the above illustration, the beneficial effect of the embodiment of the present invention is: through disposing an inorganic encapsulation layer capable of blocking the damage of water and oxygen to the LED chip in order to provide a water and oxygen isolation environment, which is beneficial to increase the luminous efficiency and life of the quantum dots. Adopting an atomic layer deposition method to form the inorganic encapsulation layer, the surface is smooth and even in thickness, the problem of cracking of the film layer will not generate. The quantum dot LED of the present embodiment can greatly increase the color gamut. When using as a backlight source, the color gamut of an LCD can reach BT2020>90%. Besides, the present invention can realize a four-side emitting of the LED, increase a square light control of HDR display, increase the quality of the LCD, and decreased the OD (optical density) height of the direct backlight module.

The above embodiments of the present invention are not used to limit the claims of this invention. Any use of the content in the specification or in the drawings of the present invention which produces equivalent structures or equivalent processes, or directly or indirectly used in other related technical fields is still covered by the claims in the present invention.

What is claimed is:

1. A quantum dot LED, comprising:

a pair of electrodes disposed separately and side by side;

an LED chip disposed on the pair of electrodes and electrically connected to the pair of electrodes;

a quantum dot layer disposed on the LED chip;

a glue layer disposed on the quantum dot layer; and an inorganic encapsulation layer that packages and covers the pair of electrodes, the LED chip, the quantum dot layer and the glue layers;

wherein the glue layer is disposed on a top surface of the quantum dot layer and interposed between the top surface of the quantum dot layer and the inorganic encapsulation layer, so as to form a layer that is in direct contact with the quantum dot layer for isolating the quantum dot layer from external moisture and oxygen and protecting the quantum dot layer against invasion of the external moisture and oxygen.

2. The quantum dot LED according to claim 1, wherein the inorganic encapsulation layer is manufactured by an atomic layer deposition method, and a thickness of the inorganic encapsulation layer is in a range of 10 nm to 120 nm.

3. The quantum dot LED according to claim 2, wherein the inorganic encapsulation layer is a single-layered structure, a material of the inorganic encapsulation layer is anyone of $Al2O_3$, $ZrO_2$, and $TiO_2$.

4. The quantum dot LED according to claim 2, wherein the inorganic encapsulation layer is a multi-layered structure, wherein a material of each layer of the multi-layered structure is anyone of $Al2O_3$, $ZrO_2$, and $TiO_2$.

5. The quantum dot LED according to claim 4, wherein materials of adjacent layers of the multi-layered structure of the inorganic encapsulation layer are different.

6. The quantum dot LED according to claim 1, wherein the quantum dot LED further includes an organic protection layer that packages and covers the inorganic encapsulation layer.

7. The quantum dot LED according to claim 6, wherein a refractive index of the organic protection layer is less than a refractive index of the inorganic encapsulation layer.

8. The quantum dot LED according to claim 1, wherein the LED chip is a blue LED chip.

9. A manufacturing method for quantum dot LED, comprising steps of:
disposing a pair of electrodes separately and side by side;
disposing an LED chip on the pair of the electrodes and electrically connecting the LED chip to the pair of the electrodes;
disposing a quantum dot layer on the LED chip;
disposing a glue layer on the quantum dot layer; and
using an atomic layer deposition method to form an inorganic encapsulation layer, and the inorganic encapsulation layer packages and covers the pair of electrodes, the LED chip, the quantum dot layer and the glue layer;
wherein the glue layer is disposed on a top surface of the quantum dot layer and interposed between the top surface of the quantum dot layer and the inorganic encapsulation layer, so as to form a layer that is in direct contact with the quantum dot layer for isolating the quantum dot layer from external moisture and oxygen and protecting the quantum dot layer against invasion of the external moisture and oxygen.

10. The manufacturing method for quantum dot LED according to claim 9, wherein the manufacturing method further includes a step of disposing an organic protection layer, and the organic protection layer packages and covers the inorganic encapsulation layer.

* * * * *